United States Patent

Gore et al.

[11] Patent Number: 6,105,226
[45] Date of Patent: Aug. 22, 2000

[54] LEADLESS CERAMIC CHIP CARRIER CROSSTALK SUPPRESSION METHOD

[75] Inventors: John G. Gore, Sorrento; Neal J. Tolar, Longwood; Roy B. Brown, Maitland; Sunder Gopani, Apopka, all of Fla.

[73] Assignee: Sawtek Inc., Orlando, Fla.

[21] Appl. No.: 09/237,212

[22] Filed: Jan. 25, 1999

Related U.S. Application Data

[62] Division of application No. 08/648,662, May 16, 1996, Pat. No. 5,864,092.

[51] Int. Cl.$^7$ ..................................................... H04R 17/00
[52] U.S. Cl. .............................. 29/25.35; 29/740; 29/832; 29/833; 29/840; 29/841; 174/524; 174/52.3; 174/52.4; 257/686; 257/693; 257/700; 257/704
[58] Field of Search ............................... 29/740, 832, 833, 29/840, 841; 174/52.2

[56] References Cited

U.S. PATENT DOCUMENTS

| | | |
|---|---|---|
| 3,520,054 | 7/1970 | Pensack et al. . |
| 3,835,531 | 9/1974 | Luttner ...................... 29/625 |
| 3,872,331 | 3/1975 | Falco . |
| 4,417,392 | 11/1983 | Ibrahim ..................... 29/840 |
| 4,551,747 | 11/1985 | Gilbert et al. . |
| 4,608,592 | 8/1986 | Miyamoto . |
| 4,658,332 | 4/1987 | Baker ...................... 361/398 |
| 4,847,136 | 7/1989 | Lo ......................... 428/195 |
| 5,135,890 | 8/1992 | Temple ..................... 437/215 |
| 5,155,905 | 10/1992 | Miller ....................... 29/843 |
| 5,177,326 | 1/1993 | Goldhammer .......... 174/52.4 |
| 5,369,551 | 11/1994 | Gore ....................... 361/767 |
| 5,418,688 | 5/1995 | Hertz ...................... 361/790 |
| 5,455,385 | 10/1995 | Newton et al. . |
| 5,461,196 | 10/1995 | Virga et al. . |
| 5,477,933 | 12/1995 | Nguyen .................... 174/262 |

OTHER PUBLICATIONS

*Low-Cost Surface Mount Packaging for SAWs*, J. Gore, B. Horine, J. Phillips, R. Hoffman and J. Dodge, Oct. 1992, 1992 Ultrasonic Symposium Proceedings, vol. 1 of 2, pp. 129–138.

*Surface Moung Package* Catalog, Kyocera Corporation, Corporate Semiconductor Parts Division, 1991.

*Mulitlayer Ceramics* Catalog, Kyocera Corporation, Corporate Semiconductor Parts Division, 1992.

*Primary Examiner*—Stephen F. Gerrity
*Assistant Examiner*—Paul D. Kim
*Attorney, Agent, or Firm*—Allen, Dyer, Doppelt, Milbrath & Gilchrist, P.A.

[57] ABSTRACT

A leadless ceramic chip carrier useful in surface mounting of SAW devices includes electrically conductive vias and metalization between input and output bond pads for improved crosstalk suppression between input and output device connections. A protrusion extending from a top layer of a multilayer ceramic carrier provides additional electrical contact to a package seal brazed thereto. The vias are positioned between input and output bond pads and connect the metalized protrusion to package ground pads through contact with multiple metalized layers of the package for enhancing the electrical connection between the package Kovar seal ring and customer accessed ground pads. For further suppression of crosstalk, bond pads within the package for connection to the SAW device are spaced at a greater distance from each other than their corresponding pads on the package bottom surface thus maintaining an optimum spacing for package connection to printed circuit board pads for minimizing thermal mismatch effects.

12 Claims, 11 Drawing Sheets

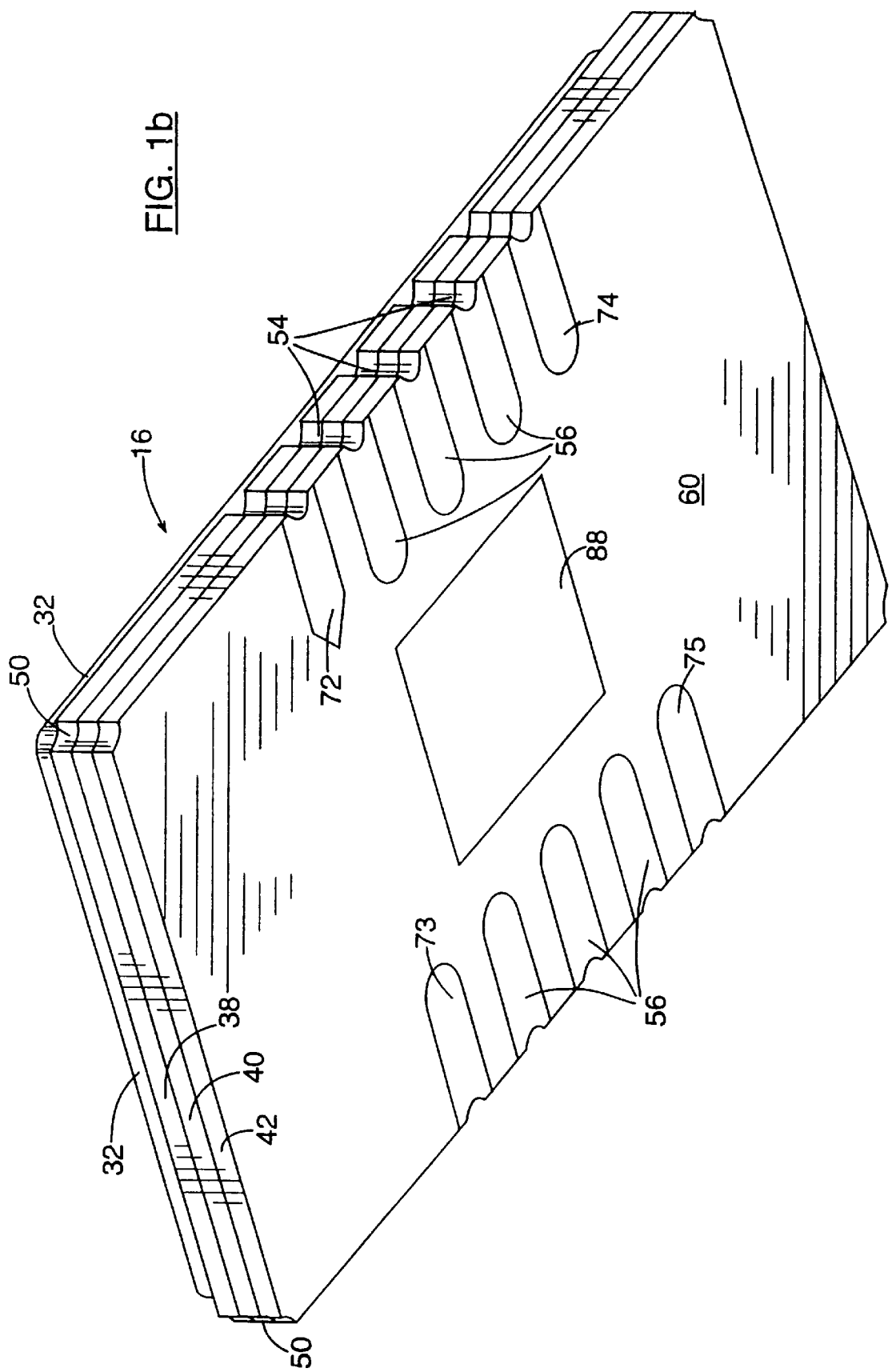

LEADLESS CERAMIC CHIP CARRIER CROSSTALK SUPPRESSION METHOD

CROSS REFERENCE TO RELATED APPLICATION

This application is a divisional of application Ser. No. 08/648,662 filed May 16, 1996 and issuing as U.S. Pat. No. 5,864,092, all commonly owned and assigned with the present application.

BACKGROUND OF INVENTION

1. Field of Invention

The invention relates to printed circuit board surface mounted electronic chip packaging and more particularly to decreasing crosstalk or electromagnetic feedthrough in leadless ceramic chip carriers for surface acoustic wave filters.

2. Description of Background Art

Surface mount technology offers several advantages for electronic equipment manufacturers including the economic advantage of increased component packing density. As described in U.S. Pat. No. 5,369,551 to Gore et al., surface mount technology carries with it the problem of thermal mismatch between the surface mount package and the printed circuit (PC) board. In particular, the thermal mismatch problems are especially acute for relatively large leadless chip carrier in which the distance between soldering pads is also relatively large.

In addition to the thermal mismatch problems, electromagnetic feedthrough, also referred to as crosstalk, between input and output circuits create undesired effects and can be one of the most troublesome sources of interference in SAW devices. By way of example, if in a design of a SAW filter, crosstalk is not sufficiently suppressed, the desired frequency response of the filter will not be achieved. Crosstalk or electromagnetic feedthrough in a SAW filter relates to the direct coupling of an input signal from input to output interdigital transducer, in the form of electromagnetic radiation. Typically, in a SAW device, crosstalk is suppressed by providing grounding and RF shielding between the input and output transducers to reduce and preferably prevent inductive or capacitive coupling in the SAW filter.

With the typically tight arrangement of SAW device and package elements, conductors proximate to each other, yet not hard wired or intended to communicate with each other, will be coupled to a degree sufficient to disrupt the intended operation of the device. Further, in leadless chip ceramic carriers (LCCC) typical in the art, grounding between the seal ring at the upper end of a package and the customer common pads on the package bottom side does not provide a sufficient ground path to adequately suppress crosstalk and thus SAW device performance is adversely affected. In some cases, crosstalk is actually enhanced by an inadequate ground path. By way of example, in the manufacturing of well known multilayer ceramic chip carriers, ground connections are made from the seal ring to the bottom side of the soldering ground pads through only the four corners of the carrier, by going through the two ceramic top layers and connecting to plated castellations on the bottom or final layer. This series and parallel combination styled grounding path does not provide sufficient RF grounding for the SAW devices earlier described.

In spite of efforts made to date, there exists a need in the packaging art, especially for SAW device surface mount packages, to provide an improved surface mount package whereby crosstalk suppression is sufficient to obtain the desired performance from the SAW device being packaged.

SUMMARY OF INVENTION

It is a primary object of the invention to reduce electromagnetic signal effects or crosstalk between SAW device input and output connections. It is another object of the invention to provide improved grounding within a surface mount package for enhancing crosstalk suppression. It is an object to enhance crosstalk suppression while maintaining package size for optimum efficiency in circuit design and reduction of thermal mismatch effects. It is another object of the present invention to provide sufficient grounding of a surface mount package for enhancing the desired response of a SAW device carried by the package. It is yet another object of the invention to provide improved grounding between the seal ring of a surface mount package and common ground pads. It is further an object of the invention to provide sufficient separation between input and output bond connections within the surface mount package for reducing crosstalk while maintaining a bond pad configuration for connection to PC board pads that minimizes thermal expansion concerns.

To meet these and other objects of the invention, an embodiment of a multilayer ceramic chip carrier useful in surface mounting high performance surface acoustic wave (SAW) devices comprises a first ceramic layer having a metalized top surface, a bottom surface and an aperture formed within a center portion of the first layer for receiving a SAW device therein, the first layer aperture forming a first layer inside wall, the first layer having a protrusion extending into the aperture from an inside wall portion, a second ceramic layer having top and bottom surfaces and an aperture formed within a center portion of the second layer for receiving the SAW device therein, the second layer aperture forming a second layer inside wall, the second layer top surface having metalized surface portions for providing internal input, output and ground connections from the carrier second layer to SAW device input, output and grounds connections respectively, the second layer top surface attached to the first layer bottom surface wherein the second layer metalized surface portions are accessible for making wire bond connections thereto, the ground connections and protrusion positioned between the input and output connections, a third ceramic layer having a metalized top surface and a bottom surface, the third ceramic layer top surface receiving the second layer bottom surface for forming a cavity, the cavity having inside walls formed from the first and second layer inside walls and a bottom wall formed from the third layer top surface, the cavity sufficient for receiving the SAW device therein, the third layer bottom surface having metalized surface portions for providing external input, output and ground connections from the carrier to input, output and ground connections on a printed circuit board, the ground connections positioned between the input and output connections, and ground connecting means for providing an ground path from the first layer metalized top surface through the protrusion and the internal ground connection to the external ground connection, the ground path positioned between respective input and output connections for providing an electromagnetic shield therebetween. In one embodiment, the ground connecting means comprises the first layer having a hole passing from the first layer top surface to the first layer bottom surface within the protrusion, the second layer having a hole passing from the second layer top surface to the bottom surface within the metalized surface portion having the internal ground connection, the third layer having a hole passing through the third layer from the metalized third layer top surface to the external ground connection, the second layer hole connected between the first and third layer holes, the holes positioned between the input and output connection, and conductive refractory material filling the holes for providing the ground path between the first layer top metalized surface and the carrier external ground connection.

In a preferred embodiment of the multilayered ceramic chip carrier or package, a first ceramic layer to which a package seal is placed comprises the protrusion to which the seal is brazed. The protrusion is electrically connected to the metalized layers on the lower ceramic layers and ultimately to package ground pads through via holes which are filled with the electrically conductive material. The via holes are strategically placed between input and output wire bond pads within the package for providing a barrier to crosstalk between input and output connections. A central ground pad is provided on the bottom side of the package for electrical connection with metalized layers of the layered package for added crosstalk suppression. Further, input and output bond wire pads within the package are separated by a greater distance than their corresponding input and output pads on the bottom surface of the package. With such an arrangement, crosstalk suppression is further enhanced within the package while thermal mismatch, greater for greater separation of solder pads, is minimized by maintaining an optimum distance between pads on the package for connection to PC boards.

BRIEF DESCRIPTION OF DRAWINGS

A preferred embodiment of the invention as well as alternate embodiments are described by way of example with reference to the accompanying drawings in which:

FIG. 1b is a bottom perspective view of the package of FIG. 1a;

DETAILED DESCRIPTION OF PREFERRED EMBODIMENT

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1A:
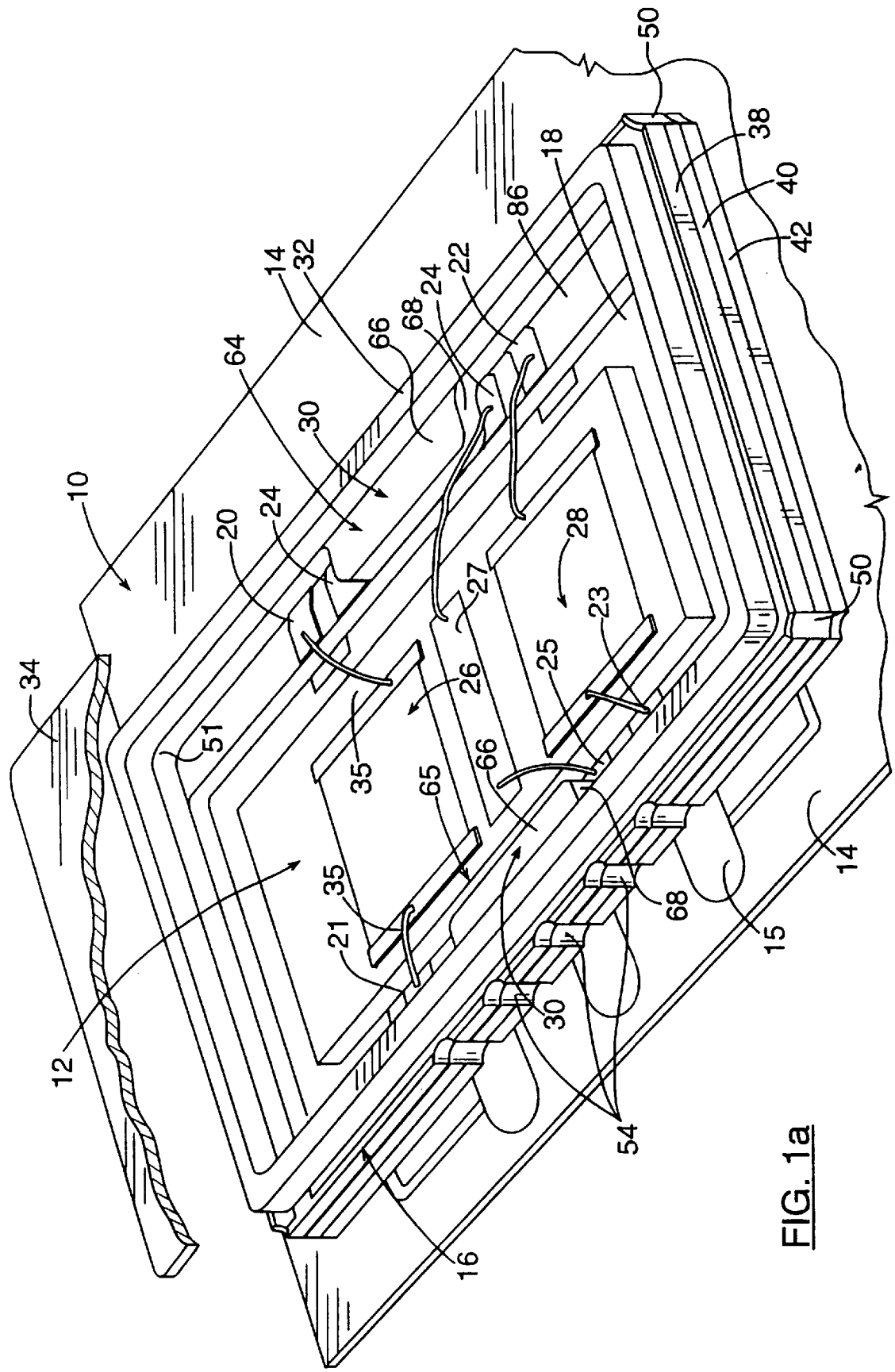
FIG. 1a is a top right perspective view of an embodiment of the present invention illustrating bond wire connection of a SAW device within a package cavity.

Referring now to FIGS. 1a and 1b, a preferred embodiment of the present invention, a surface mount package 10 for mounting a SAW device 12 onto a printer circuit board 14. The package 10 comprises a leadless ceramic chip carrier 16 having a cavity portion 18 for receiving the device 12. Within the carrier cavity portion 18, input bond pads 20, 21, wire bonded to device input transducer 26, output bond pads 22, 23 wire bonded to output transducer 28, and ground bond pads 24, 25 wire bonded to center ground strip 27 are positioned for electrically connecting the device 12 to the package 10. As is well known in the SAW art, interchangeable use of input and output transducers is permitted. For reducing crosstalk between the SAW device input transducer 26 and output transducer 28, a conductive grounded barrier 30 is formed between the input pads 20, 21 of input transducer 26 and the output pads 22, 23 of output transducer 28. It has been determined through development and testing of the present invention, that an electrically conductive barrier not providing sufficient grounding can enhance crosstalk and actually increase the electrical coupling between inputs and outputs, a situation to avoid. Again with reference to FIG. 1a, the package 10 further comprises a seal ring 32 brazed to the carrier 16 and a cover 34 itself brazed to the seal ring 32 for hermetically sealing the device 12 within the package 10. The cover 34 illustrated with reference to FIG. 1a is shown in fragmented form.

In one embodiment of the present invention, well known multilayer ceramic packaging methods and devices are improved upon with a primary object of reducing crosstalk, as earlier described.

Figure 2:
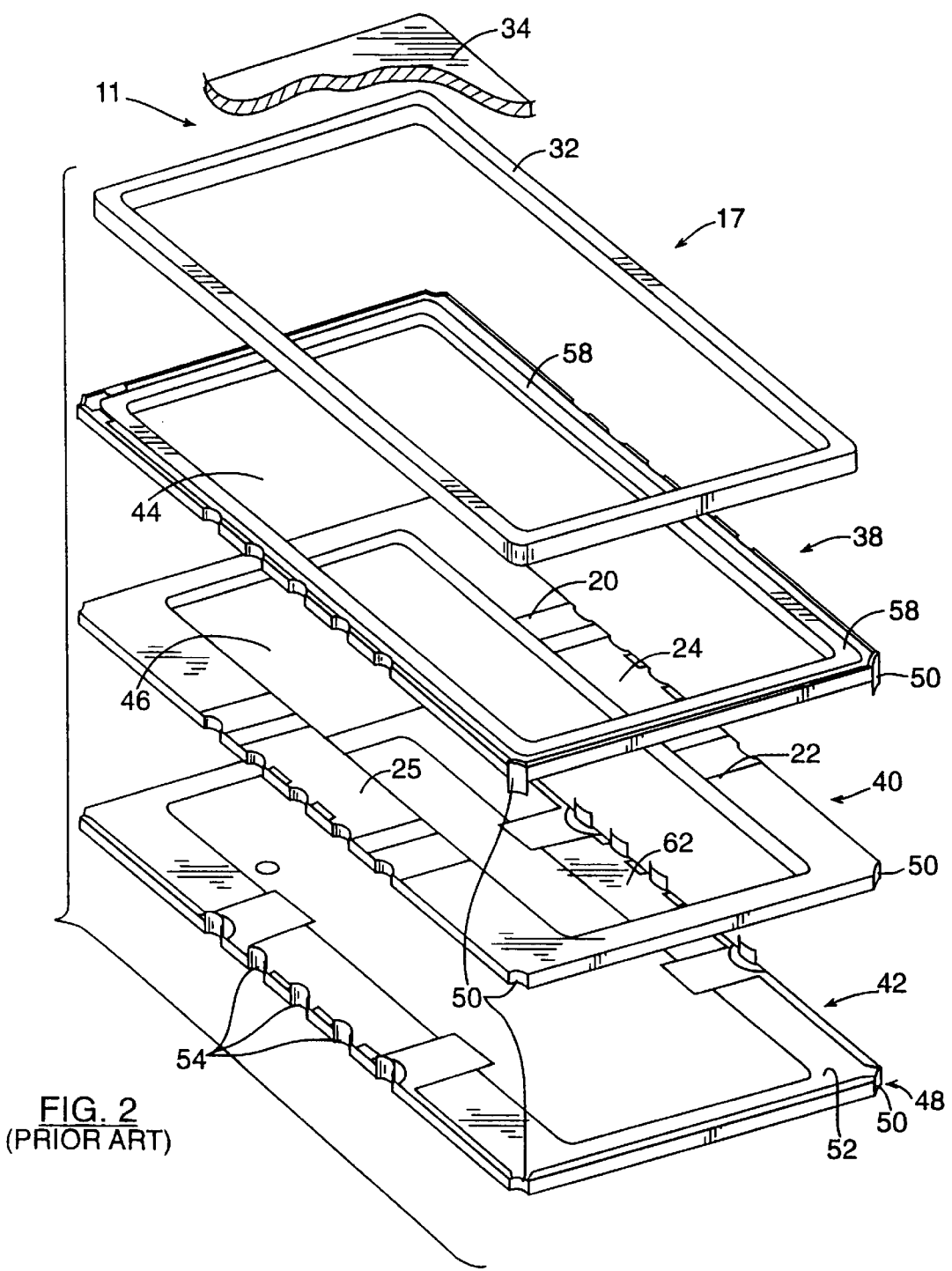
FIG. 2 is an exploded top right perspective view of a prior art multilayer leadless ceramic chip carrier.

To describe such improvements, first consider a multilayer ceramic chip carrier 17 known in the art and described herein with reference to FIG. 2, illustrated in an exploded view. As is the case for the illustrated embodiment of the present invention, the seal ring 32 forms a metallic top surface peripheral portion of the carrier 16. Typically a Kovar seal ring 32 is used and has a material composition of 54% Fe, 17% Co, and 29% Ni. Kovar is well known for its use in seal rings, lead frames, and input/output pins. When the device 12, as illustrated in FIG. 1a, is in the package 10 and all connections (e.g. attached bond wires 35) between the device 12 and carrier 16 have been made, the cover 34 is placed onto the seal ring 32 and welded thereto. In typical configurations, the cover 34 is approximately 0.005 to 0.020 inches above bond wires 35, very close when considering detrimental electromagnetic field effects.

The typical package 11 and multilayer ceramic carrier 17, illustrated in an exploded view again with reference to FIG. 2, comprises three ceramic layers, a first layer 38 attached to a second layer 40 wherein each of the first and second layers 38, 40 have center apertures 44, 46 formed therein, and a third layer 42 which forms the base 48 is attached to the second layer 40. The apertures 44, 46 and base 48 together cooperate to form the carrier cavity portion 18 described earlier with reference to the package 10 of FIGS. 1a and 1b for receiving the device 12 placed therein. Typically, grounding from the seal ring 32 to ground pads 56 on the bottom side of the base 48 is through conductive material 50 on the four outside corners of the carrier 16. The conductive material 50 is carried by corners of the layers 38, 40, and 42 and is electrically connected to a metalization surface 52 within the cavity portion 18 on the third layer 42 which forms the base 48 of the package 10. The metalization surface 52 extend within the hermetically sealed cavity portion 18 to plated ground castellations 54 on outside surfaces of the carrier 16. The castellations 54 are then electrically connected to the connection ground pads 56 on the bottom of the carrier 16 for connection to pads on a printed circuit board. Such a series and parallel path for electrically grounding the seal ring 32 to the ground pads 56 typically does not provide an adequate RF ground and unacceptable levels of crosstalk between inputs and outputs of the device 12 exists. The embodiment of the present invention includes the corner conductive material 50 and as illustrated with reference to FIGS. 1a and 3, also contains internal corner conductive material 51 on layer and seal ring corner portions.

Again with reference to FIG. 2, in this type of leadless ceramic chip carrier, the three layers 38, 40, and 42 are typically made from unsintered ceramic sheets. Each sheet is stacked and bonded to form the multilayer or laminated carrier construction. The layers 38, 40 are punched to form the apertures 44, 46 which when laminated together with the third layer 42 form the carrier 16. Metalization surface portions are formed on each layer. The first layer 38 has a metalization surface portion formed generally on a top surface 58 to which the seal ring 32 is brazed as earlier described. The second layer 40 has metalization surface portions which define the input 20, output 22 and ground 24 pads within the carrier cavity portion 18 to which the device bond wires 35 are attached as earlier described. The base 48, the third layer 42, has the metalization surface 52 as earlier described and a metalization surface 60 on its bottom side described later in further detail. Typically the third layer 42 is the only ceramic layer with metalization surfaces on both top and bottom surfaces of the layer 42.

With ceramic and metalization multilayer carriers typical in the art, crosstalk is not adequately reduced, especially when using high performance SAW devices 12. As described earlier, the electrical ground path from the seal ring 32 to the ground pads 56 for connection to printed circuit pads 15, is through the four corner conductive material 50, four corner metalized radii on the exterior of the carrier 17. Typically, this metal is added by refractory metalization which is very thin. Although some metalized surfaces are gold plated to improve electrical conductivity, typically these four corners are not. Further, in addition to poor conductivity through the corner conductive material 50, the location of the corners relative to the SAW device 12 and wire bonds is remote. In addition, the only conductive path from the seal ring 32 to the ground pad 62 on the metalized surface 52 of the third layer 42 is through the corner conductive material 50, the plated radii along the side of the carrier 16 that conduct from the metalized surface 52 to corresponding ground pads 56 on the bottom side of the carrier 16. The result is a series and parallel path from seal ring 32 to ground pads 56 that is somewhat resistive and not strategically located relative to the SAW device 12 and the bond wires 35.

Figure 3:
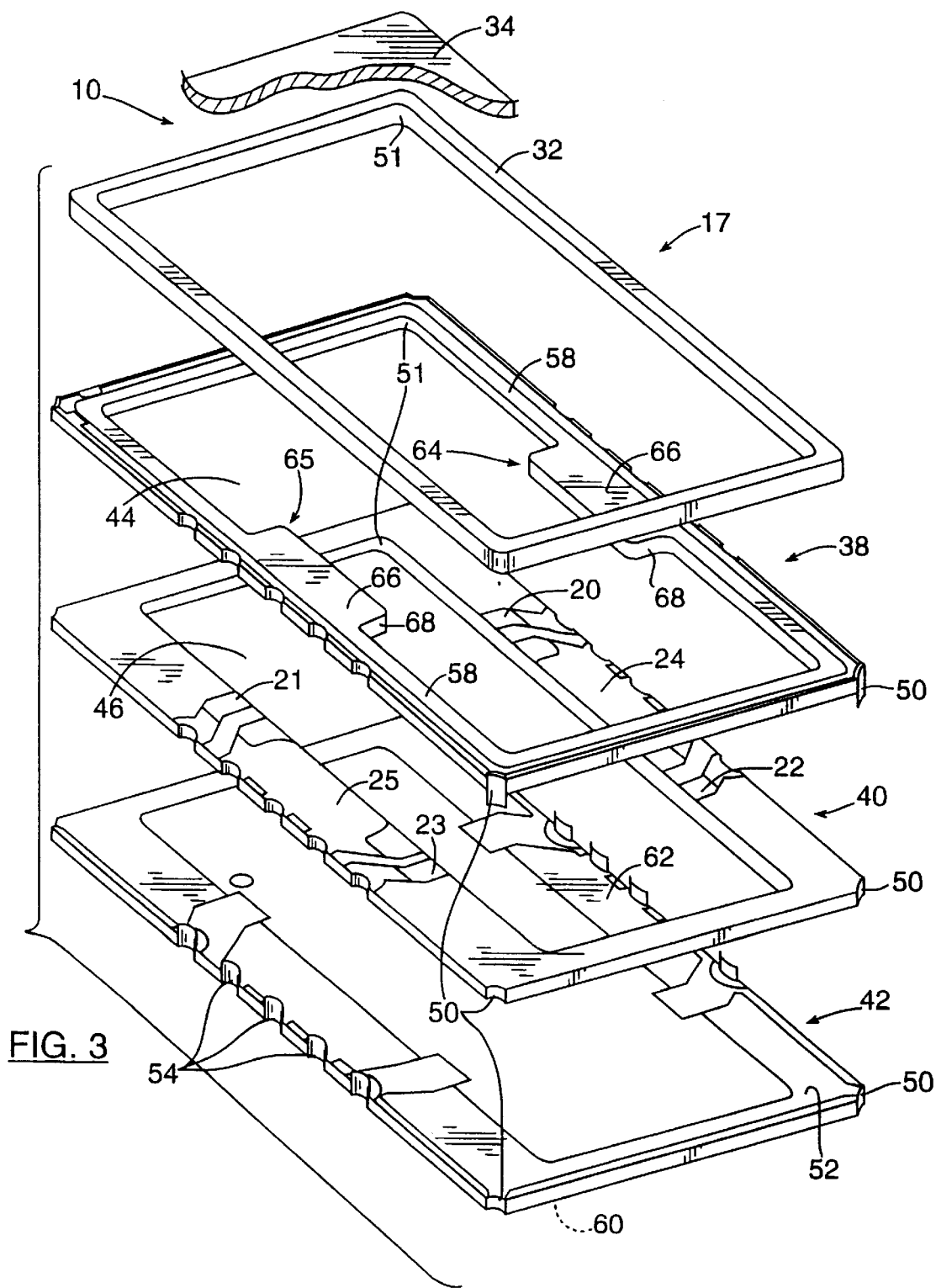
FIG. 3 is an exploded top right perspective view of a multilayer leadless ceramic chip carrier embodiment of the present invention.

As earlier stated, an object of the present invention is to provide a surface mount package with improved grounding and RF shield between the inputs and outputs of the SAW device for reducing electromagnetic feedthrough effects. By constraining overall internal and external package configurations to those known and currently used in the art, the embodiment of the package 10 of the present invention satisfies an important need in the industry. With reference to similar elements as described with reference to FIG. 2, the package 10 described with reference to FIGS. 1a, 1b and 3 is further detailed.

Figure 4:
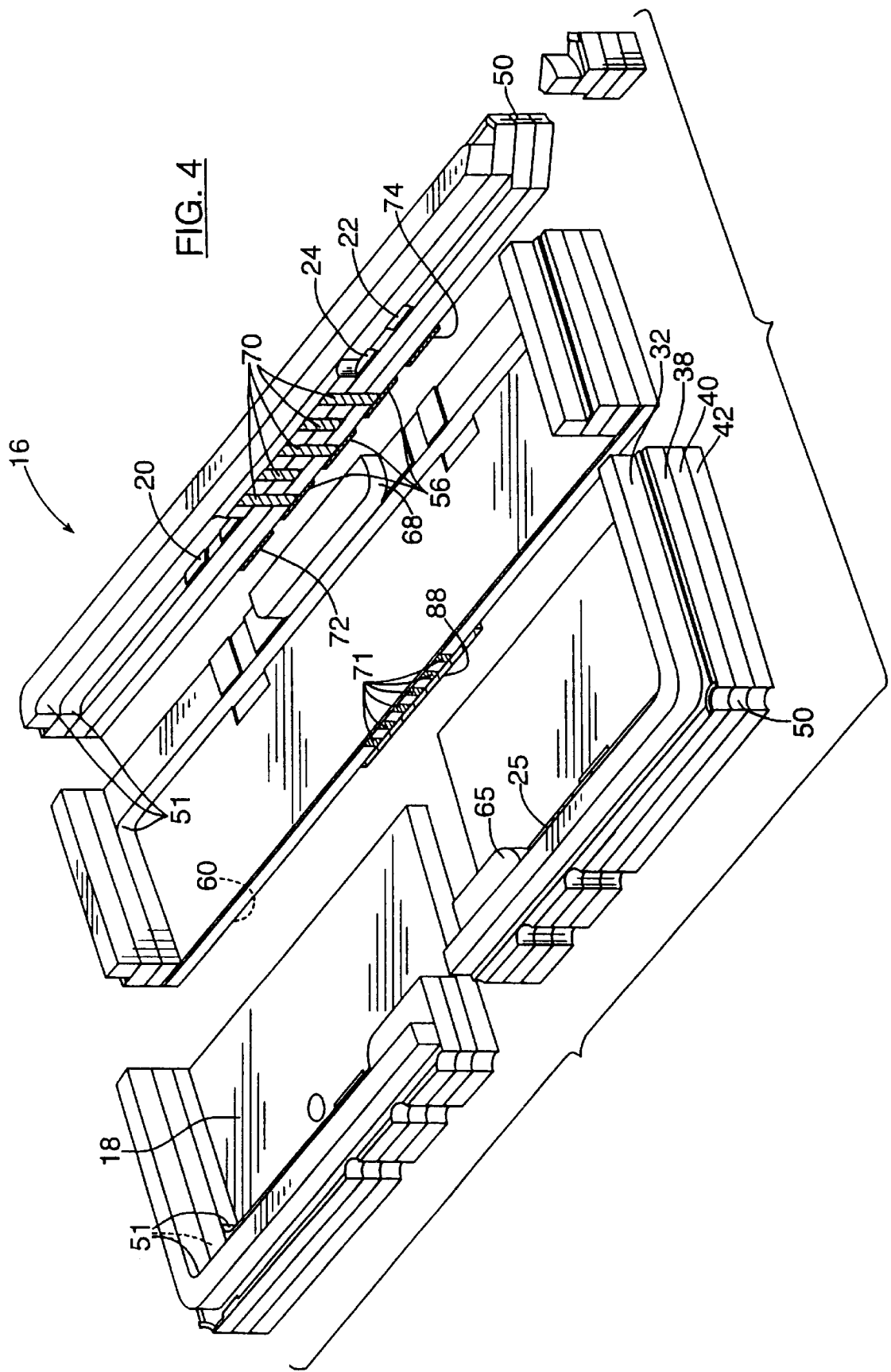
FIG. 4 is a transverse and longitudinal fragmented perspective view of an embodiment of the present invention for a leadless ceramic chip carrier of FIGS. 1a and 1b.

With reference to FIG. 3 and again to FIG. 1a, the leadless ceramic chip carrier 16 includes a first layer 38 having a protrusion 64 (part of the barrier 30 earlier described) which extends inwardly into the cavity portion 18. The protrusion 64 is positioned for placement between the input pad 20 and output pad 22 and includes a metalized top surface 66 contiguous with the metalized surface 58 of the first layer 38. The protrusion 64 extends sufficiently into the cavity portion 18 to permit via holes (described later in greater detail) filled with conductive refractory material to pass from contact with the conductive protrusion top metal surface 66 to ground pads 62 on the bottom surface of the carrier 16. At the same time, opposing protrusions 64, 65 extending into the cavity portion 18 are limited in size for permitting the device 12 selected for use to be placed therebetween and within the cavity portion 18 of the carrier 16. When assembled, the carrier internal ground pads 24, 25 are in electrical contact with the respective protrusion 64, 65 electrically conductive surface 66 through a metalized side surface 68 in addition to electrical contact through the conductive vias 70 as illustrated with reference to FIG. 4 of a transversely and longitudinally fragmented perspective view of an a carrier 16. The protrusions 64, 66 thus provide an electrical shield between the input and output pads 20, 21, 22, 23 as illustrated again with reference to FIGS. 1a, 1b and 3. Through the brazing of the seal ring 32 to the first layer top surface 58, the increased surface area provided by the protrusion top metalized surface 66, and the conductive vias 70, an improved, direct, electrical path from the seal ring 32 to the ground pads 56 is provided.

The placement of the vias 70 as described, provides an excellent ground plane between device input and output channels and thus a strong barrier to crosstalk. The vias 70 in an embodiment illustrated with reference to FIGS. 4 and 5a–5d are located approximately midway between an inner wall 80 and outer wall 82 of the first layer 38 as measured along a plane passing through the protrusion 64. As illustrated with reference to FIGS. 1b, 4, 6a–6d, five conductively filled vias 70 provide the lowered resistance path (when compared to the four corners earlier described) from the first layer 38 through the second layer 40 and onto the bottom or third layer 42. In addition to the vias 70 within the second layer 40, the ground metalization that is part of second layer metalization surface portions 84 is positioned directly between the input 20, 21 and output 22, 23 internal connection pads and covers most of the metalized surface area between the input and output pads on both sides of the internal wire bond pad shelf 86 as illustrated again with reference to FIGS. 6b and 1a.

Figure 5A:
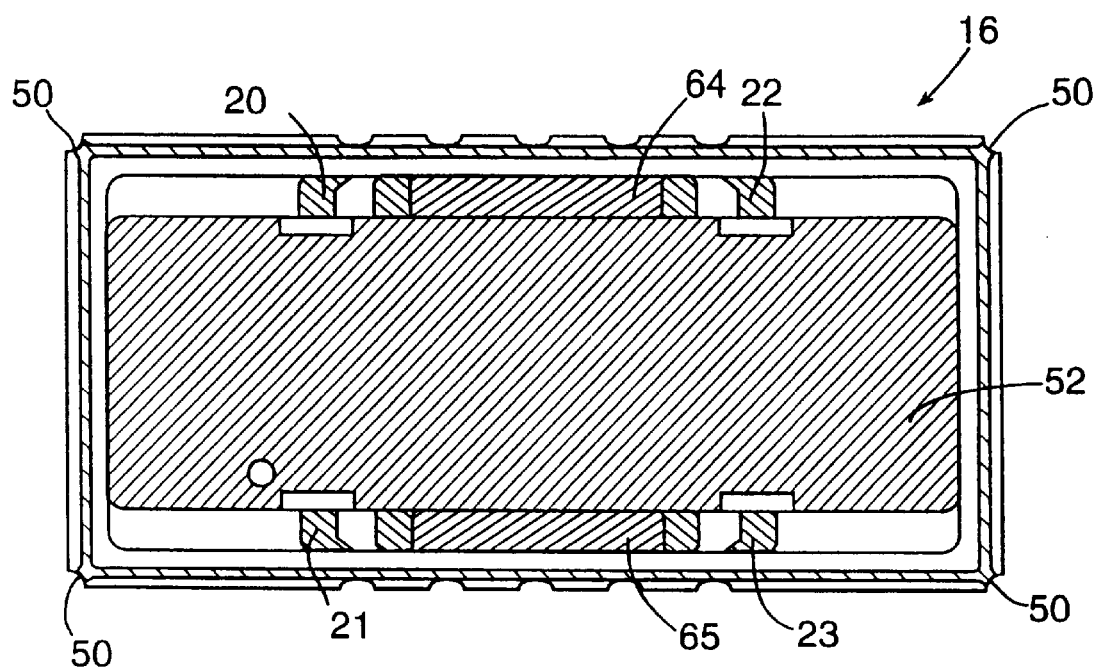
FIGS. 5a and 5b are top and bottom plans views respectively of a metalized ceramic base layer for an embodiment of the present invention.
Figure 5B:
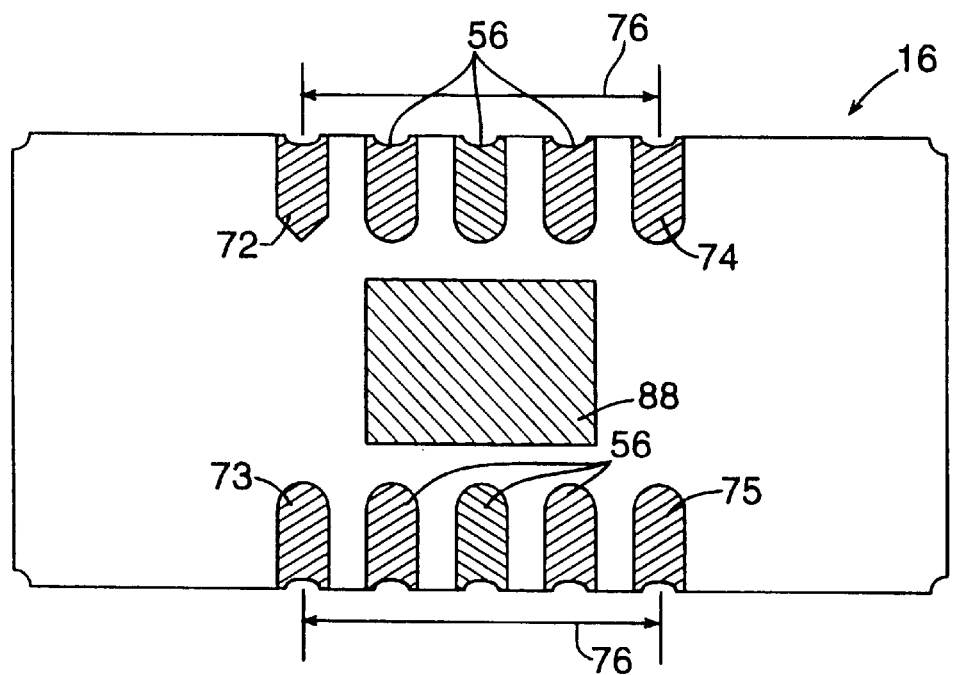
Figure 5C:
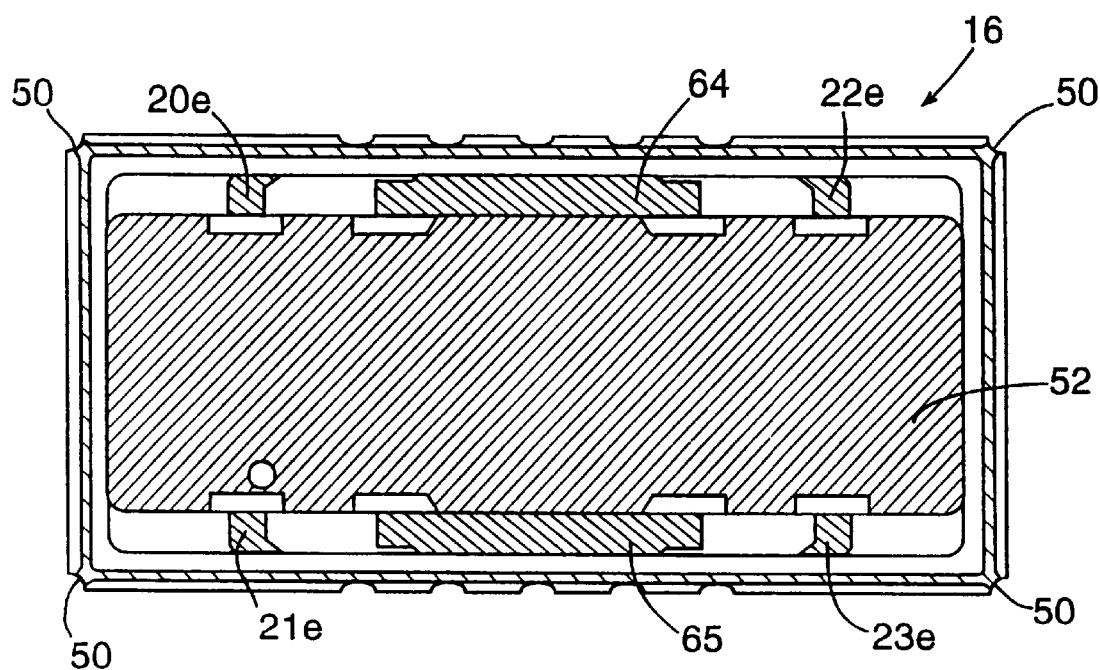
FIG. 5c is a top plan view of a metalized base ceramic layer illustrating an increased separation between carrier internal input and output pads.
Figure 6A:
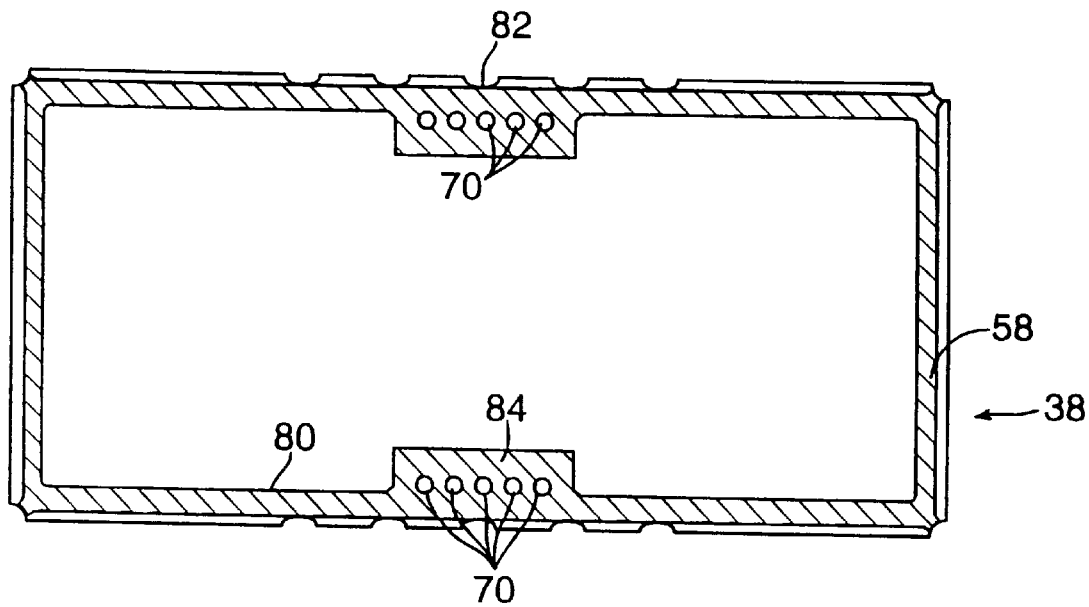
FIGS. 6a–6d are plan views illustrating metalized layers within an embodiment of a multilayer ceramic carrier of the present invention.
Figure 6B:
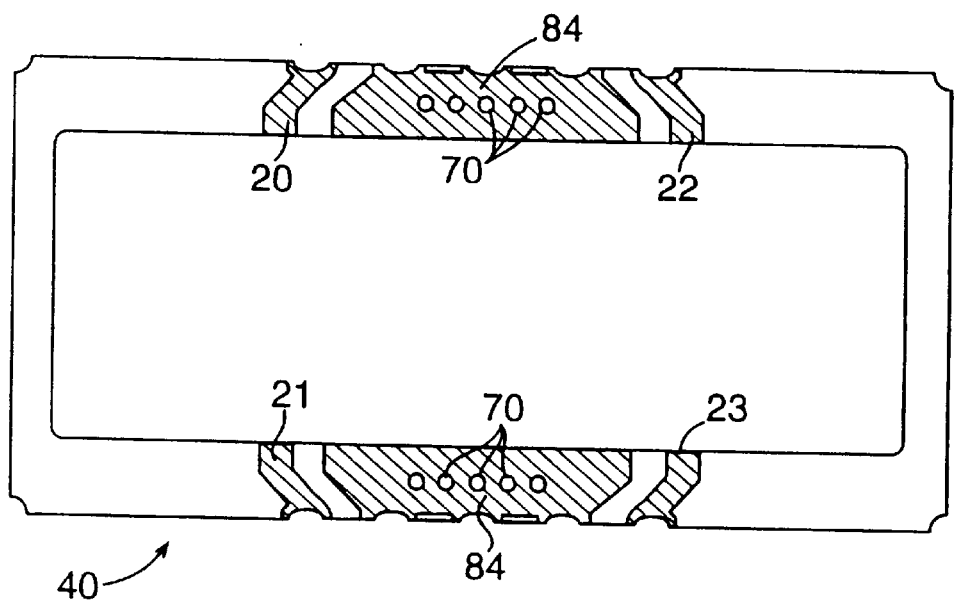
Figure 6C:
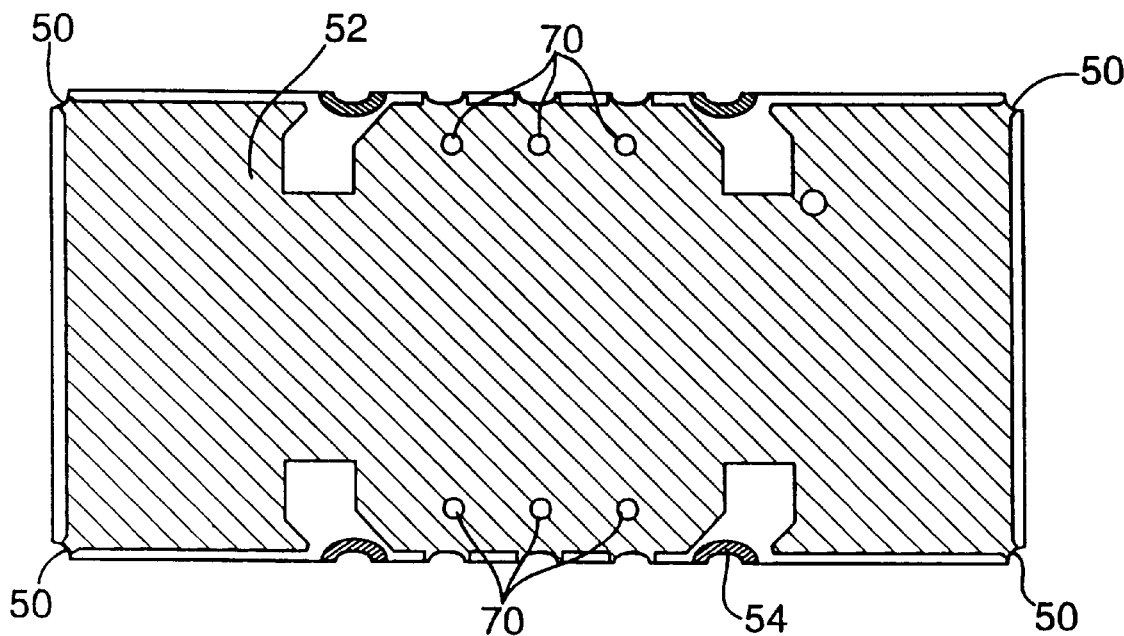
Figure 6D:
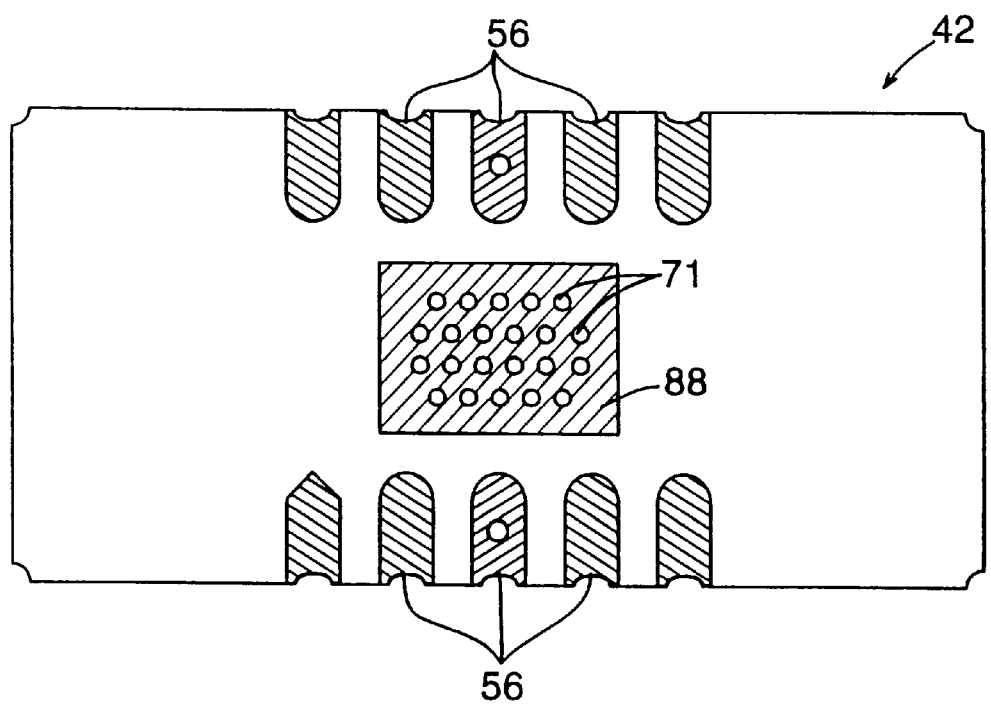
Figure 6E:
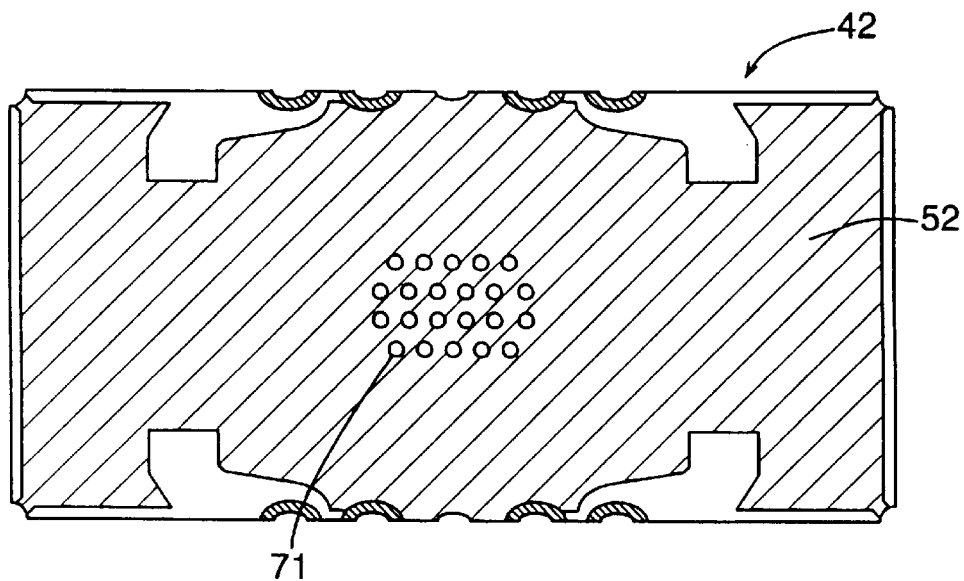
FIGS. 6e and 6f are plan views illustrating alternate embodiments of metalized ceramic layers using extended separations between input and output internal bond pads.
Figure 6F:
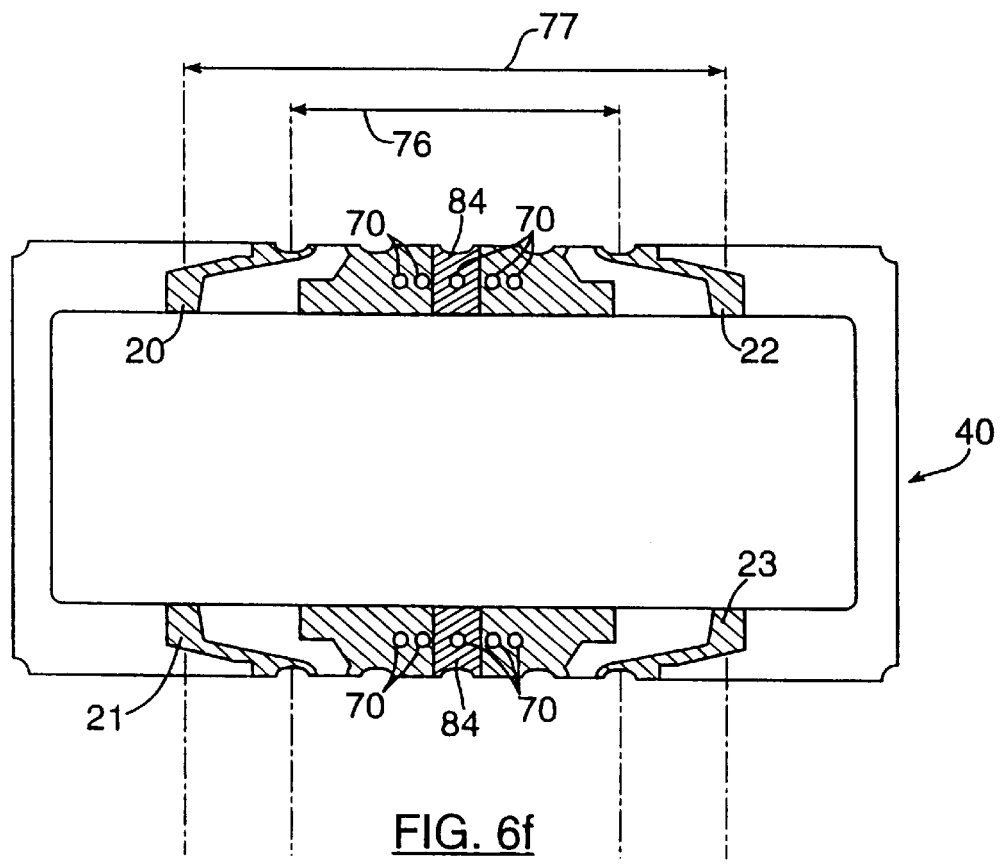

Further, and as illustrated with reference to FIGS. 5a–5c, the separation 76 between carrier bottom side input 72, 73 and output 74, 75 pads are positioned for typical connection with pads of a printed circuit board, thus eliminating the need for PC board redesign. In addition, by maintaining as small a distance between bottom side input 72 73 and output 74, 75 pads as possible, well known problems associated with thermal mismatch are reduced. However, by having a greater separation 77 between internal input 20, 21 and output 22, 23 pads, as illustrated again with reference to FIG. 6f, crosstalk is sufficiently reduced for an effective operation of the SAW device 12, an object of the present invention. An examples of the greater separation 77 of input and output pads 20e, 21e, 22e, 23e is also illustrated with reference to FIG. 5c, a plan view of a metalized ceramic layer. Further, bond wires connected between the SAW device and internal input and output pads will be positioned in a non-parallel, typically radially diverging orientation due to the increased separation between the internal input and output pads and device pads, an arrangement which further aids in crosstalk suppression.

Again with reference to FIGS. 4, 5a–5c, and 6d–6re in the package 10 illustrated by way of example for the present invention, twenty two conductive vias 71 within a matrix configuration are located in a central portion of the carrier base 48 and penetrate the third layer 42 for connecting the third layer internal ground plane metalized surface 52 with a rectangular central ground pad 88 located on the underside of the package 10. Such an arrangement provides further RF shielding between the device input and output. By way of example, when "hot" input and "hot" output connections are on opposing sides of a package 10, the straight line path between these hot connections is obstructed by the twenty two electrically conductive vias 71 while the "hot" input and output return connections are obstructed by the vias 70 that make connection to the ground pads 62 on each side of the package 10. Thus, the vias 70, 71 and metalization surfaces herein described for the various ceramic layers 38, 40, 42 provide an effective crosstalk barrier.

Figure 7A:
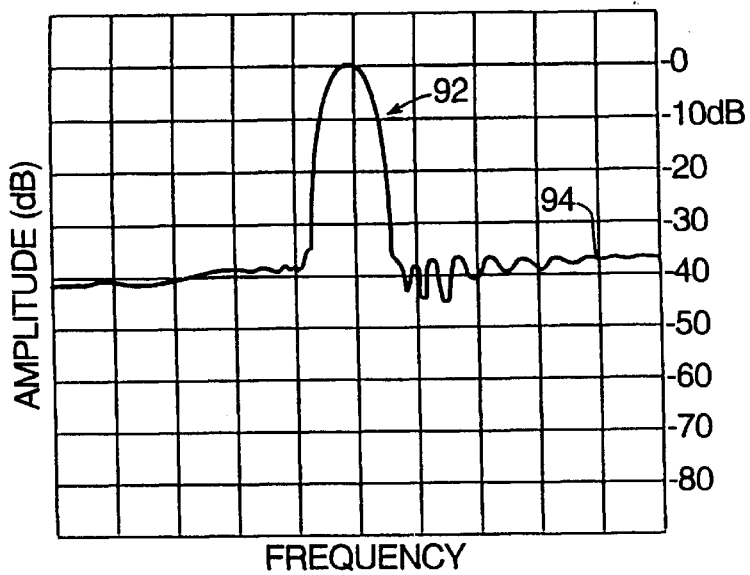
FIGS. 7a–7c are frequency response profiles of a SAW filter packaged within a typical surface mount package; a simulated package having enhanced grounding using metal filled via holes; and a package of a preferred embodiment of the present invention comprising filled via holes, protrusions and separation of bond pads, respectively.
Figure 7B:
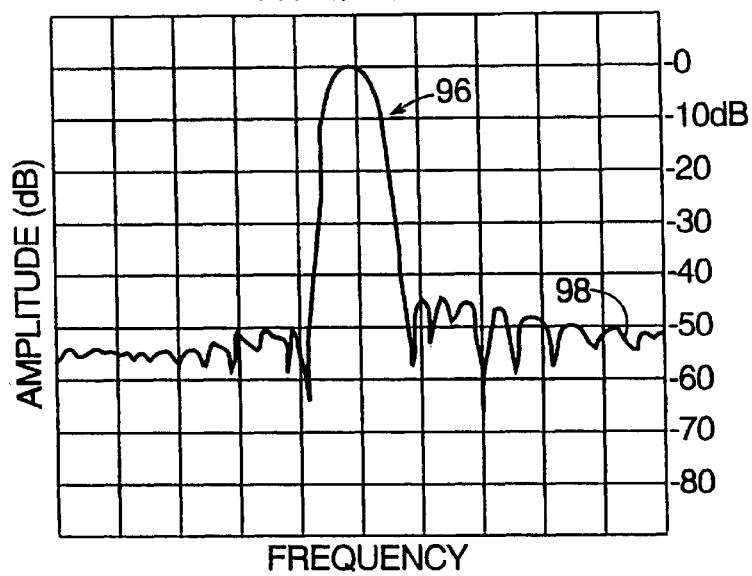
Figure 7C:
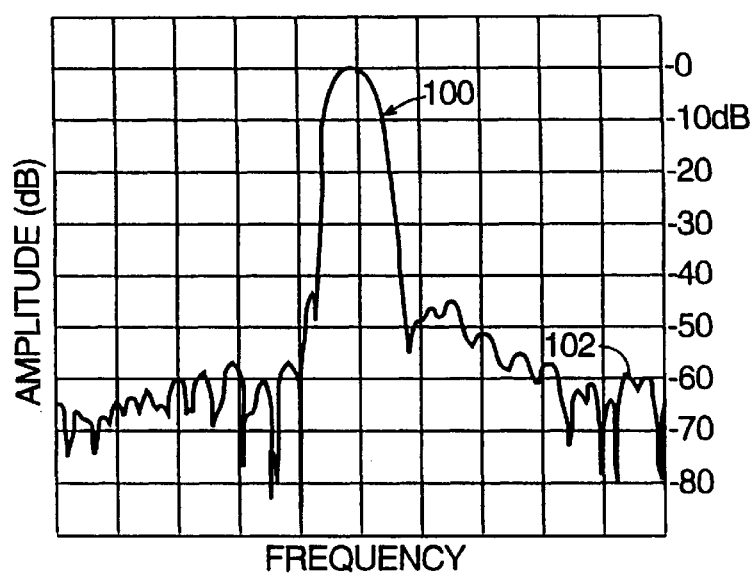

By way of example, and with reference to FIGS. 7a–7c, the embodiment of the package 10 herein described provides significant improvement in crosstalk suppression. FIG. 7a illustrates a measured frequency response 92 of a SAW device within a prior art package having the carrier 17 earlier described. Crosstalk levels 94 of approximately −40 dB result in an inadequate side lobe performance for the device. FIG. 7b illustrates a measured frequency response of the same SAW device in a surface mount package using bond wires or conductive epoxy to simulate the conductive vias through the ceramic layers, but in this example without the protrusion. As illustrated with reference to FIG. 7b, cross talk suppression 98 is improved by more than 10 dB. However, by including the vias, the protrusions, and the increased separation between internal input and output pads, the response 100 illustrated with reference to FIG. 7c is realized. As illustrated, the reduction in crosstalk 102 for the SAW device by more than 25 dB is achieved over the package of the prior art. Performance of operational devices within the package of the present invention show significant crosstalk suppression as well.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and alternate embodiments are intended to be included within the scope of the appended claims.

What is claimed is:

1. A method for suppressing crosstalk between inputs and outputs of a SAW device surface mounted for operation with a printed circuit board, the method comprising the steps of:

laminating a first ceramic layer to a second ceramic layer wherein the first ceramic layer comprises a metalized top surface, a bottom surface and an aperture formed within a center portion of the first layer for receiving a SAW device therein, the first layer aperture forming a first layer inside wall, the first layer further having a protrusion extending into the aperture from an inside wall portion, and wherein the second ceramic layer comprises top and bottom surfaces and an aperture formed within a center portion of the second layer for receiving the SAW device therein, the second layer aperture forming a second layer inside wall, the second layer top surface having metalized surface portions for providing internal input, output and ground connections from the carrier second layer to SAW device input, output and grounds connections respectively, the second layer top surface attached to the first layer bottom surface wherein the second layer metalized surface portions are accessible for making wire bond connections thereto, the ground connections and protrusion positioned between the input and output connections;

forming a cavity for receiving the SAW package by laminating a third ceramic layer to the second layer, the third layer comprising a metalized top surface and a bottom surface, the third ceramic layer top surface receiving the second layer bottom surface for forming the cavity, the cavity having inside walls formed from the first and second layer inside walls and a bottom wall formed from the third layer top surface, the third layer bottom surface having metalized surface portions for providing external input, output and ground connections from the carrier to input, output and ground connections on a printed circuit board, the ground connections positioned between the input and output connections; and electrically connecting the first layer metalized top surface through the protrusion and the internal ground connection to the external ground connection, the electrical connecting having a path positioned between respective input and output connections for providing an electromagnetic shield therebetween.

2. A method according to claim 1 wherein the electrically connecting step comprises the steps of:

forming a hole through the first layer while passing the hole from the first layer top surface to the first layer bottom surface within the protrusion;

forming a hole through the second layer while passing the hole from the second layer top surface to the bottom surface within the metalized surface portion having the internal ground connection;

forming a hole through the third layer while passing the hole through the third layer from the metalized third layer top surface to the external ground connection, the second layer hole connected between the first and third layer holes, the holes positioned between the input and output connection; and filling the holes with conductive refractory material for providing the electrical path between the first layer top metalized surface and the carrier external ground connection.

3. A method according to claim 1 further comprising the step of attaching a seal ring to the first layer metalized top surface for providing an electrical connection therebetween.

4. A method according to claim 1 further comprising the steps of:

placing a conductive seal ring onto the metalized top surface;

placing a conductive cover onto the seal ring; and brazing the seal ring between the cover and first layer top surface for hermetically sealing the device within the carrier.

5. A carrier according to claim 1 further comprising the step of separating the internal input and output connections on the second layer top surface to a greater separation that between the external input and output connections on the third layer bottom surface.

6. A method according to claim 1 further comprising the steps of:
    attaching an external central ground pad to the third layer bottom surface; and
    electrically connecting the external ground pad to the third layer metalized surface.

7. A method according to claim 6 wherein the electrical connecting step comprises the steps of:
    forming a hole in the third layer and passing the hole between the first layer top metalized surface and the central ground pad; and
    filling the hole with conductive refractory material passing therethrough for electrically connecting the external ground pad to the metalized top surface.

8. A method according to claim 1 further comprising the step of attaching metalized material along inside wall portions for providing electrical connection between the internal ground connection and the first layer metalized top surface.

9. A method according to claim 1 wherein the external ground connecting step comprises the step of connecting multiple ground pads by forming electrically conductive vias between each ground pad and the first layer metalized surface, the vias passing within the protrusion, the conductive vias further in electrical contact with the metalized third layer top surface and the second layer ground connection metalized surface portion.

10. A method for suppressing crosstalk in surface acoustic wave (SAW) devices held within a surface mount package, the method comprising the steps of:
    placing a SAW device within a cavity of a leadless chip carrier, the carrier having a metalized top portion attached to a seal ring, the carrier further having a protrusion extending into the cavity, the protrusion having a top metalized surface within electrical connection to the seal ring, the protrusion positioned between internal input and output pads within the cavity, the protrusion further having an electrical connection to an external ground pad positioned between corresponding external input and output pads, the electrical path passing between respective input and output pads for providing an electromagnetic shield therebetween.
    attaching bond wires from the SAW device to the internal input, output and ground pads within the cavity; and
    attaching a conductive cover onto the seal ring for hermetically sealing the SAW device within the carrier.

11. A method according to claim 10, further comprising the step of electrically connecting pads of a printed circuit board to cooperating external input, output and ground pads on a carrier bottom surface, the external ground pad positioned between the external input and output pads.

12. A method according to claim 10 wherein the attaching step comprises the step of brazing the conductive cover onto the carrier top portion.

* * * * *